United States Patent
Parteder et al.

(10) Patent No.: US 11,355,386 B2
(45) Date of Patent: Jun. 7, 2022

(54) METHOD FOR MANUFACTURING A SEMICONDUCTOR DEVICE AND SEMICONDUCTOR DEVICE

(71) Applicant: ams AG, Premstaetten (AT)

(72) Inventors: Georg Parteder, Premstaetten (AT); Jochen Kraft, Premstaetten (AT); Raffaele Coppeta, Premstaetten (AT)

(73) Assignee: AMS AG, Premstaetten (AT)

( * ) Notice: Subject to any disclaimer, the term of this patent is extended or adjusted under 35 U.S.C. 154(b) by 193 days.

(21) Appl. No.: 16/647,304

(22) PCT Filed: Aug. 23, 2018

(86) PCT No.: PCT/EP2018/072767
§ 371 (c)(1),
(2) Date: Mar. 13, 2020

(87) PCT Pub. No.: WO2019/057436
PCT Pub. Date: Mar. 28, 2019

(65) Prior Publication Data
US 2021/0366764 A1    Nov. 25, 2021

(30) Foreign Application Priority Data
Sep. 20, 2017 (EP) .................................. 17192105

(51) Int. Cl.
*H01L 21/768* (2006.01)
*H01L 23/48* (2006.01)

(52) U.S. Cl.
CPC ...... *H01L 21/76802* (2013.01); *H01L 23/481* (2013.01)

(58) Field of Classification Search
CPC ............. H01L 21/76898; H01L 23/481; H01L 2225/06541; H01L 21/76831;
(Continued)

(56) References Cited

U.S. PATENT DOCUMENTS

| 6,716,737 | B2 * | 4/2004 | Plas | ................. | H01L 21/76898 |
| | | | | | 438/612 |
| 7,094,701 | B2 * | 8/2006 | Umemoto | ......... | H01L 21/76898 |
| | | | | | 438/706 |

(Continued)

FOREIGN PATENT DOCUMENTS

| EP | 1 653 510 | 5/2006 |
| EP | 2 597 677 | 5/2013 |

(Continued)

OTHER PUBLICATIONS

European Search Report for International Search Report for PCT/EP2018/072767 dated Nov. 6, 2018.

*Primary Examiner* — Bac H Au
(74) *Attorney, Agent, or Firm* — MH2 Technology Law Group LLP

(57) ABSTRACT

A method for manufacturing a semiconductor device is provided. The method comprises the steps of providing a semiconductor body, forming a trench in the semiconductor body in a vertical direction which is perpendicular to the main plane of extension of the semiconductor body, and coating inner walls of the trench with an isolation layer. The method further comprises the steps of coating the isolation layer at the inner walls with a metallization layer, coating a top side of the semiconductor body, at which the trench is formed, at least partially with an electrically conductive contact layer, where the contact layer is electrically connected with the metallization layer, coating the top side of the semiconductor body at least partially and the trench with a capping layer, and forming a contact pad at the top side of the semiconductor body by removing the contact layer and the capping layer at least partially. Furthermore, a semiconductor device is provided.

12 Claims, 5 Drawing Sheets

(58) Field of Classification Search
CPC ....... H01L 2224/0557; H01L 23/49827; H01L 21/76802
See application file for complete search history.

(56) References Cited

U.S. PATENT DOCUMENTS

| | | | |
|---|---|---|---|
| 7,339,273 B2 * | 3/2008 | Kameyama | H01L 24/13 257/774 |
| 7,646,100 B2 * | 1/2010 | Kameyama | H01L 24/06 257/774 |
| 8,378,496 B2 * | 2/2013 | Schrank | H01L 24/03 257/774 |
| 8,440,565 B2 * | 5/2013 | Muta | H01L 23/49827 438/667 |
| 8,492,902 B2 * | 7/2013 | Lee | H01L 25/105 257/774 |
| 8,980,738 B2 * | 3/2015 | Chapelon | H01L 23/481 438/612 |
| 9,012,324 B2 * | 4/2015 | Chen | H01L 21/76898 438/667 |
| 9,070,643 B2 * | 6/2015 | Nagata | H01L 23/481 |
| 9,093,505 B2 * | 7/2015 | Chapelon | H01L 21/76898 |
| 9,123,789 B2 * | 9/2015 | Lin | H01L 21/283 |
| 9,337,125 B2 * | 5/2016 | Park | H01L 23/481 |
| 9,349,673 B2 * | 5/2016 | Yoda | H01L 21/76804 |
| 9,613,864 B2 * | 4/2017 | Lu | H01L 21/76831 |
| 9,859,191 B2 * | 1/2018 | Lee | H01L 23/5384 |
| RE47,087 E * | 10/2018 | Nagata | H01L 21/76898 |
| 10,403,575 B2 * | 9/2019 | Herdt | H01L 21/76898 |
| 2006/0087042 A1 * | 4/2006 | Kameyama | H01L 24/13 257/774 |
| 2006/0148250 A1 * | 7/2006 | Kirby | H01L 25/50 438/667 |
| 2010/0314758 A1 * | 12/2010 | Wu | H01L 21/76898 257/737 |
| 2011/0108986 A1 * | 5/2011 | Lin | H01L 21/76898 257/751 |
| 2011/0244676 A1 * | 10/2011 | Chen | H01L 21/76816 438/643 |
| 2012/0074584 A1 * | 3/2012 | Lee | H01L 21/76898 257/774 |
| 2013/0015504 A1 | 1/2013 | Kuo et al. | |
| 2017/0207158 A1 | 7/2017 | Kang et al. | |
| 2018/0204803 A1 * | 7/2018 | Herdt | H01L 23/481 |
| 2021/0342671 A1 * | 11/2021 | Hoang | H01L 25/18 |

FOREIGN PATENT DOCUMENTS

| | | |
|---|---|---|
| JP | 2008-053430 | 3/2008 |
| TW | 201405775 A | 2/2014 |
| TW | 201505154 A | 2/2015 |
| WO | 2009/013315 | 1/2009 |
| WO | 2010/083922 | 7/2010 |
| WO | 2011/039167 | 4/2011 |
| WO | 2016/007141 | 1/2016 |

* cited by examiner

METHOD FOR MANUFACTURING A SEMICONDUCTOR DEVICE AND SEMICONDUCTOR DEVICE

CROSS-REFERENCE TO RELATED APPLICATIONS

The present application is the national stage entry of International Patent Application No. PCT/EP2018/072767, filed on Aug. 23, 2018, which claims the benefit of priority of European Patent Application No. 17192105.9, filed on Sep. 20, 2017, all of which are hereby incorporated by reference in their entirety for all purposes.

BACKGROUND OF THE INVENTION

The present disclosure relates to a method for manufacturing a semiconductor device and to a semiconductor device.

Semiconductor devices can comprise through-silicon-vias in order to form an electrical contact from a top side of the semiconductor device to an integrated circuit of the semiconductor device. A through-silicon-via extends through the silicon substrate of the semiconductor device and it comprises an electrically conductive layer which is isolated against the silicon substrate. The electrically conductive layer forms the electrical contact between the top side and the integrated circuit. In order to protect the electrically conductive layer a capping layer may be deposited on top of the electrically conductive layer.

Between or within the different layers of the through-silicon-vias and the silicon substrate stress can occur for example due to different coefficients of thermal expansion. The stress can be induced during the manufacturing of the semiconductor device. Stress between or within different layers of the through-silicon-via and the silicon substrate can lead to cracks in the through-silicon-via, especially in the electrically conductive layer. Therefore, leakage currents can arise during operation of the semiconductor device which can lead to a reduced lifetime of the device or to a failure of the device.

SUMMARY OF THE INVENTION

This disclosure provides a method for manufacturing a semiconductor device which enables the production of an efficient semiconductor device. to the disclosure further provides an efficient semiconductor device.

According to at least one embodiment of the method for manufacturing a semiconductor device, the method comprises the step of providing a semiconductor body. The semiconductor body can be a substrate or a wafer. This means the semiconductor body is a three-dimensional body and it can be a cuboid. The semiconductor body comprises a semiconductor material which can be, for example, silicon.

The method further comprises the step of forming a trench in the semiconductor body in a vertical direction which is perpendicular to the main plane of extension of the semiconductor body. The trench can be etched in the semiconductor body and it is formed from a top side of the semiconductor body. An electrically conductive contact portion which is arranged within the semiconductor body can act as an etch stop for the etching of the trench. This means, the contact portion is arranged at a distance from the top side and the trench extends from the top side towards the contact portion. The contact portion can be an electrically conductive layer that is electrically connected with an integrated circuit of the semiconductor device.

For example, the trench can have a circular shaped cross section. It is also possible that the trench has a cross-section that is different from a circle. The diameter of the trench can amount to for example 40 µm or 80 µm. The size of the cross section of the trench can be constant in vertical direction.

The method further comprises the step of coating inner walls of the trench with an isolation layer. The trench comprises a bottom surface which is the surface of the trench that is the furthest away from the top side. From the bottom surface the inner walls of the trench extend towards the top side and the inner walls extend in the vertical direction. The isolation layer can be deposited at the top side and it thus covers the inner walls of the trench and the bottom surface of the trench. Furthermore, the isolation layer can cover the top side. Preferably, the isolation layer completely covers the inner walls of the trench and the top side.

The isolation layer can comprise an electrically isolating material as for example silicon dioxide ($SiO_2$) or silicon nitride ($Si_3N_4$). As the inner walls of the trench extend in vertical direction, the thickness of the isolation layer at the inner walls can be different from the thickness of the isolation layer at the top side. Furthermore, the thickness of the isolation layer at the inner walls can vary from the side of the top side towards the side of the bottom surface. The thickness in a lateral direction of the isolation layer close to the bottom surface can be at least 200 nm, where the lateral direction is perpendicular to the vertical direction.

After coating the inner walls of the trench with the isolation layer, the isolation layer can be removed from the bottom surface of the trench.

The method further comprises the step of coating the isolation layer at the inner walls with a metallization layer. This means, the metallization layer is deposited at the inner walls of the trench and at the bottom surface of the trench. Preferably, the metallization layer completely covers the isolation layer at the inner walls. The metallization layer can comprise an electrically conductive material, as for example tungsten. If the isolation layer is removed from the bottom surface of the trench, the metallization layer is in direct contact with the contact portion.

The method further comprises the step of coating a top side of the semiconductor body, at which the trench is formed, at least partially with an electrically conductive contact layer, where the contact layer is electrically connected with the metallization layer. The contact layer is deposited at the top side of the semiconductor body. It is possible that the contact layer only partially covers the top side. The contact layer can comprise for example aluminum. The metallization layer and the contact layer are in direct contact at the top side. It is possible that the contact layer extends within the trench at the top side. This means, the contact layer can cover a part of the inner walls with the isolation layer and the metallization layer in the region of the trench close to the top side.

The method further comprises the step of coating the top side of the semiconductor body at least partially and the trench with a capping layer. This means, the capping layer covers the top side at least partially. Preferably, the inner walls and the bottom surface of the trench are completely covered with the capping layer. This means, the capping layer is in direct contact with the metallization layer at the inner walls and with the contact layer at the top side. The capping layer can comprise an electrically isolating material as for example $SiO_2$ or $Si_3N_4$. The capping layer can be deposited via pressure enhanced chemical vapor deposition.

As the capping layer is deposited at the top side of the semiconductor body the thickness of the capping layer can be different at the top side in comparison to the thickness close to the bottom surface of the trench.

The method further comprises the step of forming a contact pad at the top side of the semiconductor body by removing the contact layer and the capping layer at least partially. The contact layer and the capping layer can be removed at least partially at the top side by employing a mask and by etching both layers at least partially or in some places. The contact pad comprises a part of the contact layer and the contact pad is electrically connected with the metallization layer of the trench. The capping layer is removed from the contact pad such that the contact pad can be electrically contacted at the top side of the semiconductor body.

The trench with the isolation layer, the metallization layer and the capping layer forms a through-silicon-via through the substrate body. Therefore, the contact portion that can be electrically connected with an integrated circuit can be electrically contacted at the contact pad.

The isolation layer is arranged to electrically isolate the metallization layer from the semiconductor body. In order to achieve an isolation at all places of the metallization layer the isolation layer is required to be thick enough such that irregularities of the semiconductor body at the inner walls are covered completely by the isolation layer. However, the thicker the isolation layer is, the more stress is built up in the metallization layer during processing. Stress in the metallization layer can lead to cracks in the metallization layer. In this case leakage currents could occur or the electrical connection from the contact pad to the contact portion could be interrupted. Therefore, the properties of the isolation layer, the metallization layer and the capping layer are set in such a way that stress between or within these layers is minimized. The properties of these layers depend on their materials and their thicknesses. For the method described here the properties of the isolation layer, the metallization layer the capping layer are set in such a way that the probability for the formation of cracks in the metallization layer and thus of leakage currents is minimized. Thus, the lifetime of the semiconductor device is increased and it can be operated more efficiently.

According to at least one embodiment of the method, the contact layer and the capping layer are in direct contact with each other at the top side of the semiconductor body. This means, the capping layer is directly deposited on top of the contact layer at the top side. The capping layer acts as a protection for the underlying contact layer during the formation of the contact pad. Therefore, the contact layer and the capping layer are advantageously in direct contact and the contact pad is formed after the deposition of the capping layer. In this way, the contact layer can be protected by the capping layer during manufacturing steps where the temperature is increased and decreased again. These temperature steps can induce stress in the contact layer which is compensated by the capping layer. Therefore, the formation of cracks in the contact layer is avoided.

According to at least one embodiment of the method, the capping layer is formed after the deposition of the contact layer. This means, the capping layer is deposited on top of the contact layer. Therefore, the capping layer and the contact layer are in direct contact and the capping layer can act as a protection for the underlying contact layer.

According to at least one embodiment of the method, the capping layer comprises a dielectric material. The capping layer can for example comprise $SiO_2$ or $Si_3N_4$. In this way, the capping layer can act as a protection for the contact layer.

According to at least one embodiment of the method, for forming the contact pad the capping layer is removed from the contact layer at least partially. The capping layer is removed from the contact layer at least partially such that a contact pad comprising a part of the contact layer is formed which can be electrically contacted at the top side. The contact pad can have a rectangular shape or the shape of a circle. It is also possible that the contact pad has another shape.

According to at least one embodiment of the method, the trench comprises an inner volume which is not filled with any material. This means, the trench is not completely filled with the materials of the isolation layer, the metallization layer and the cap layer. The inner walls of the trench are coated with the different layers such that the outermost layers of two different walls do not touch. In this way, less material is required than for the case that the trench is filled completely.

According to at least one embodiment of the method, the thickness in lateral direction of the capping layer amounts to at least 200 nm at the side of the trench that faces away from the top side of the semiconductor body, where the lateral direction is perpendicular to the vertical direction. As the capping layer is deposited at the top side of the semiconductor body the thickness of the capping layer at the inner walls can decrease from the top side in the direction of the bottom surface. The thickness of the capping layer at the walls is given in the lateral direction. This means, the thickness of the capping layer in the region close to the bottom surface amounts to at least 200 nm. The thickness at the side of the trench that faces away from the top side of the semiconductor body refers to the thickness in lateral direction at the walls in the region or close to the bottom surface. Furthermore, the thickness of the capping layer at the inner walls in lateral direction in the plane of the bottom surface amounts to at least 200 nm.

As the thickness of the capping layer can decrease from the top side towards the bottom surface it is possible that the thickness of the capping layer in the region of the top side amounts to 1 to 5 µm. It is also possible that the thickness of the capping layer linearly decreases from the top side towards a bottom surface.

Preferably, the thickness of the capping layer approximately equals the thickness of the isolation layer at the side of the trench that faces away from the top side. This means for example, that the thickness of the capping layer at the side of the trench that faces away from the top side differs by less than 20% from the thickness of the isolation layer at the side of the trench that faces away from the top side. It is also possible that the thickness of the capping layer is equal to the thickness of the isolation layer at the side of the trench that faces away from the top side. In this case, the probability for the formation of cracks in the metallization layer and thus of leakage currents is minimized. Furthermore, the capping layer stabilizes mechanically the underlying metallization layer during the manufacturing process.

For a thickness of the capping layer of at least 200 nm at the side of the trench that faces away from the top side on the one hand the capping layer is thick enough to mechanically stabilize the metallization layer and the through-silicon-via and on the other hand the capping layer is thin enough such that the probability for the formation of cracks in the metallization layer is minimized.

According to at least one embodiment of the method, the method further comprises the step of coating the top side of the semiconductor body and the trench with a passivation layer. Preferably, the passivation layer is deposited after the deposition of the capping layer. The passivation layer covers the capping layer at the inner walls of the trench and at the bottom surface and furthermore the top side. The passivation layer can comprise $Si_3N_4$. Preferably, the passivation layer does not comprise an oxide.

According to at least one embodiment of the method, the passivation layer is in direct contact with the capping layer and with an inner volume of the trench. This means, that the passivation layer is directly deposited on top of the capping layer and no further layer is deposited on top of the passivation layer. Therefore, the passivation layer is in direct contact with the inner volume of the trench. As no further layer is deposited on top of the passivation layer no further processing step is required which could induce cracks in one of the layers due to temperature changes.

According to at least one embodiment of the method, the metallization layer is electrically connected with an integrated circuit of the semiconductor device. The metallization layer can for example be electrically connected with the integrated circuit via the contact portion. In this way, the integrated circuit can be electrically contacted at the contact pad at the top side. Therefore, the semiconductor device can for example be surface-mountable.

According to at least one embodiment of the method, the isolation layer comprises at least two layers. The at least two layers of the isolation layer are deposited directly on top of each other. It is further possible that the isolation layer comprises three layers. For example, a first layer of the isolation layer can comprise $SiO_2$, a second layer of the isolation layer can comprise $Si_3N_4$ and a third layer of the isolation layer can comprise $SiO_2$. With the isolation layer comprising at least two layers the mechanical stability of the through-silicon-via or the layers within the trench can be improved. The interfaces between the different layers of the isolation layer can act as stop layers for the growth of cracks. Therefore, an isolation layer comprising at least two layers improves the mechanical stability.

Furthermore, a semiconductor device is provided. The semiconductor device can optionally be produced by means of one of the methods described herein. This means, all features disclosed for the method for manufacturing a semiconductor device are also disclosed for the semiconductor device and vice-versa.

In at least one embodiment of the semiconductor device, the semiconductor device comprises a semiconductor body. The semiconductor body can be a substrate or a wafer and it can comprise a semiconductor material which can be for example silicon.

The semiconductor device further comprises a trench that extends through at least a part of the semiconductor body in vertical direction from a top side of the semiconductor body, where the vertical direction is perpendicular to the main plane of extension of the semiconductor body. The trench extends from a top side of the semiconductor body towards a contact portion. The contact portion can be an electrically conductive layer that is electrically connected with an integrated circuit of the semiconductor device.

The semiconductor device further comprises an isolation layer covering at least partially inner walls of the trench and the top side of the semiconductor body. The trench comprises a bottom surface which is the surface of the trench that is the furthest away from the top side. From the bottom surface the inner walls of the trench extend towards the top side and the inner walls extend in the vertical direction. Preferably, the isolation layer completely covers the inner walls of the trench and the top side but not the bottom surface. The isolation layer can comprise an electrically isolating material as for example $SiO_2$ or $Si_3N_4$.

The semiconductor device further comprises a metallization layer covering the isolation layer. This means, the isolation layer is arranged between the semiconductor body and the metallization layer. Preferably, the metallization layer covers the isolation layer at the inner walls and top side and furthermore the bottom surface. The metallization layer can comprise an electrically conductive material as for example tungsten.

The semiconductor device further comprises an electrically conductive contact pad at the top side of the semiconductor body, where the contact pad is electrically connected with the metallization layer. The contact pad partially covers the top side of the semiconductor body. The contact pad is directly arranged on top of the isolation layer. The contact pad comprises an electrically conductive material which can be for example aluminum. The contact pad can be in direct contact with the metallization layer such that they are electrically connected.

The semiconductor device further comprises a capping layer covering the top side of the semiconductor body at least partially and the metallization layer. The contact pad is at least partially free of the capping layer. Preferably, the metallization layer is completely covered by the capping layer. This means, the capping layer can be in direct contact with the metallization layer at the inner walls. The capping layer can comprise an electrically isolating material as for example silicon dioxide or silicon nitride.

The trench with the isolation layer, the metallization layer and the capping layer forms a through-silicon-via through the substrate body. Therefore, the contact portion that can be electrically connected with an integrated circuit can be electrically contacted at the contact pad.

In at least one embodiment of the semiconductor device a passivation layer covers the capping layer and the top side of the semiconductor body at least partially and at least one side surface of the contact pad is in direct contact with the passivation layer. Preferably, the passivation layer is directly deposited on top of the capping layer. This means, the capping layer can be arranged between the passivation layer and the metallization layer. As the contact pad covers the top side only partially it comprises at least one side surface that is not parallel, but for example perpendicular or obliquely, to the main plane of extension of the semiconductor body. The shape of the contact pad can for example be formed via etching. The capping layer that is arranged on top of the material of the contact pad is optionally etched away in the same step as the contact layer. Therefore, the capping layer does not cover the at least one side surface of the contact pad. As the passivation layer is deposited after the etching of the contact pad and the capping layer, the passivation layer is in direct contact with the contact pad at at least one side surface of the contact pad. Preferably, the passivation layer does not comprise an oxide.

In at least one embodiment of the semiconductor device the thickness in lateral direction of the capping layer amounts to at least 200 nm at the side of the trench that faces away from the top side of the semiconductor body, where the lateral direction is perpendicular to the vertical direction. As the capping layer is deposited at the top side of the semiconductor body the thickness of the capping layer at the inner walls can decrease from the top side in the direction of the bottom surface. The thickness at the side of the trench that faces away from the top side of the semiconductor body refers to the thickness in lateral direction at the walls in the region or close to the bottom surface.

Preferably the thickness of the capping layer approximately equals the thickness of the isolation layer at the side of the trench that faces away from the top side. It is also possible that the thickness of the capping layer is equal to the thickness of the isolation layer at the side of the trench that faces away from the top side. In this case, the probability for the formation of cracks in the metallization layer is minimized. Furthermore, the capping layer stabilizes mechanically the underlying metallization layer during the manufacturing process.

For a thickness of the capping layer of at least 200 nm at the side of the trench that faces away from the top side on the one hand the capping layer is thick enough to mechanically stabilize the metallization layer and the through-silicon-via and on the other hand the capping layer is thin enough such that the probability for the formation of cracks in the metallization layer is minimized. Consequently, the semiconductor device is more stable, the lifetime is increased and it can be operated more efficiently.

BRIEF DESCRIPTION OF THE DRAWINGS

The following description of figures may further illustrate and explain embodiments of the method for manufacturing a semiconductor device and of the semiconductor device. Components that are functionally identical or have an identical effect are denoted by identical references. Identical or effectively identical components might be described only with respect to the figures where they occur first. Their description is not necessarily repeated in successive figures.

With the cutaway view of an embodiment of the semiconductor device shown in FIG. 1 the method for manufacturing a semiconductor device is described.

With FIGS. 4 to 8 the probability for the propagation of cracks in embodiments of the semiconductor device is shown.

Figure 9:
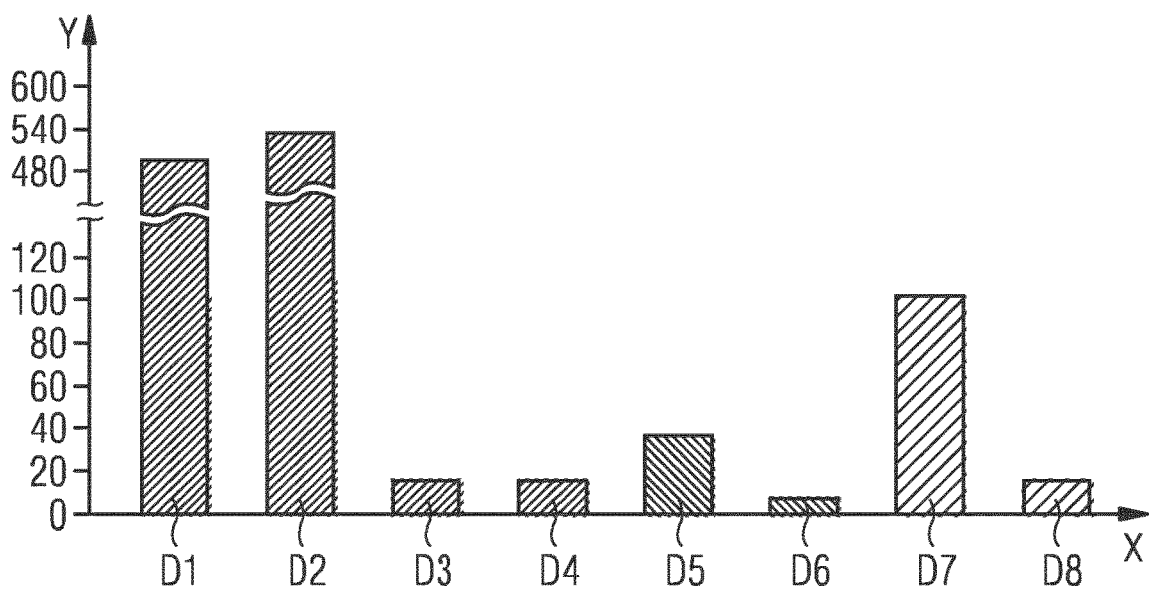

In FIG. 9 the failure rates of different semiconductor devices are compared.

DETAILED DESCRIPTION

Figure 1:
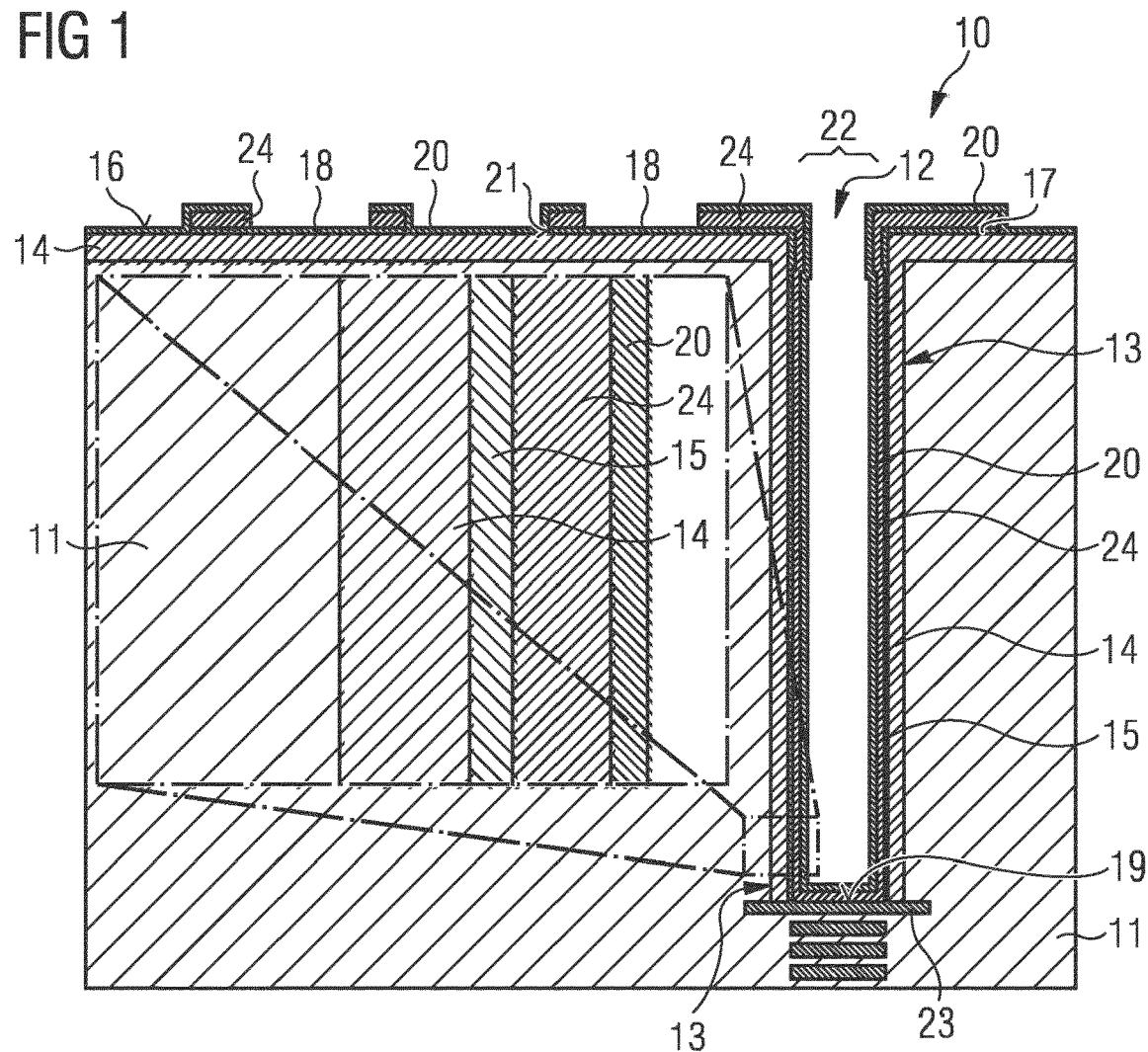

In FIG. 1 a cutaway view of an embodiment of a semiconductor device 10 is shown. The semiconductor device 10 comprises a through-silicon-via 22 which comprises several layers. A section of the through-silicon-via 22 is enlarged to show the arrangement of the different layers. For manufacturing the semiconductor device 10 a semiconductor body 11 is provided which comprises silicon. In the semiconductor body 11 a trench 12 is formed in a vertical direction z which is perpendicular to the main plane of extension of the semiconductor body 11. The trench 12 is formed by etching the semiconductor body 11 from a top side 16 of the semiconductor body 11. The trench 12 extends from the top side 16 towards a contact portion 23. The contact portion 23 is an electrically conductive layer which is electrically connected with an integrated circuit of the semiconductor device 10 which is not shown in FIG. 1.

The trench 12 comprises inner walls 13 that extend in vertical direction z and a bottom surface 19 at the side of the trench 12 which faces away from the top side 16. After forming the trench 12 the inner walls 13 of the trench 12, the bottom surface 19 and the top side 16 are completely coated with an isolation layer 14. As the isolation layer 14 is deposited at the top side 16 the thickness of the isolation layer 14 is larger at the top side 16 than at the inner walls 13. The thickness of the isolation layer 14 at the top side 16 is given in vertical direction z and the thickness of the isolation layer 14 at the inner walls 13 is given in lateral direction x which is perpendicular to the vertical direction z. The isolation layer 14 can comprise $SiO_2$ or $Si_3N_4$.

After the deposition of the isolation layer 14, the isolation layer 14 is removed from the bottom surface 19. At next, a metallization layer 15 is deposited at the top side 16, at the inner walls 13 and at the bottom surface 19. The metallization layer 15 comprises an electrically conductive material as for example tungsten. This means, the metallization layer 15 is in direct contact with the contact portion 23. The metallization layer 15 is removed or etched away at the top side 16, such that the metallization layer 15 only covers the isolation layer 14 at the inner walls 13 and the bottom surface 19.

In a next step, the top side 16 is coated with an electrically conductive contact layer 17 which can comprise aluminum. At the top side 16 of the trench 12 the contact layer 17 partially covers the inner walls 13. In the area where the contact layer 17 covers the inner walls 13 the thickness of the electrically conductive material is shown to be larger than in other places of the wall 13. The contact layer 17 partially covers the inner walls 13 in order to establish an electrical connection between the contact layer 17 and the metallization layer 15.

At next, a capping layer 24 is deposited at the top side 16, at the inner walls 13 and at the bottom surface 19. This means, the capping layer 24 is in direct contact with the contact layer 17 and no other layer than the capping layer 24 is deposited directly after the deposition of the contact layer 17. The capping layer 24 completely covers the top side 16, the inner walls 13 and the bottom surface 19. The capping layer 24 can comprise $SiO_2$ or $Si_3N_4$. The thickness in lateral direction x of the capping layer 24 can be at least 200 nm at the side of the trench 12 that faces away from the top side 16.

After the deposition of the capping layer 24, contact pads 18 are formed at the top side 16. For the formation of the contact pads 18 the contact layer 17 and the capping layer 24 are removed or etched away from the top side 16 in some places. In lateral direction x next to the trench 12 a contact pad 18 is formed. Next to the contact pad 18 the capping layer 24 and the contact layer 17 are removed such that a further contact pad 18 is formed. Furthermore, the contact layer 17 and the capping layer 24 are removed on the other side of the trench 12 and next to the further contact pad 18. The contact pads 18 comprise a part of the contact layer 17. One of the contact pads 18 is electrically connected with the metallization layer 15 and thus with the contact portion 23. Therefore, the integrated circuit of the semiconductor device 10 can be electrically contacted at the contact pad 18.

After forming the contact pad 18, a passivation layer 20 is deposited at the top side 16, at the inner walls 13 and at the bottom surface 19. The passivation layer 20 completely covers the top side 16, the inner walls 13 and the bottom surface 19. Preferably, the passivation layer 20 does not comprise an oxide but is for example formed by $Si_3N_4$. After the deposition of the passivation layer 20 the trench 12 comprises an inner volume which is not filled with any material.

At next, the passivation layer 20 is partially removed from the contact pads 18 such that they can be electrically contacted. Thus, the contact pads 18 comprise side surfaces 21 that extend in vertical direction z and that are in direct contact with the passivation layer 20.

Figure 2:
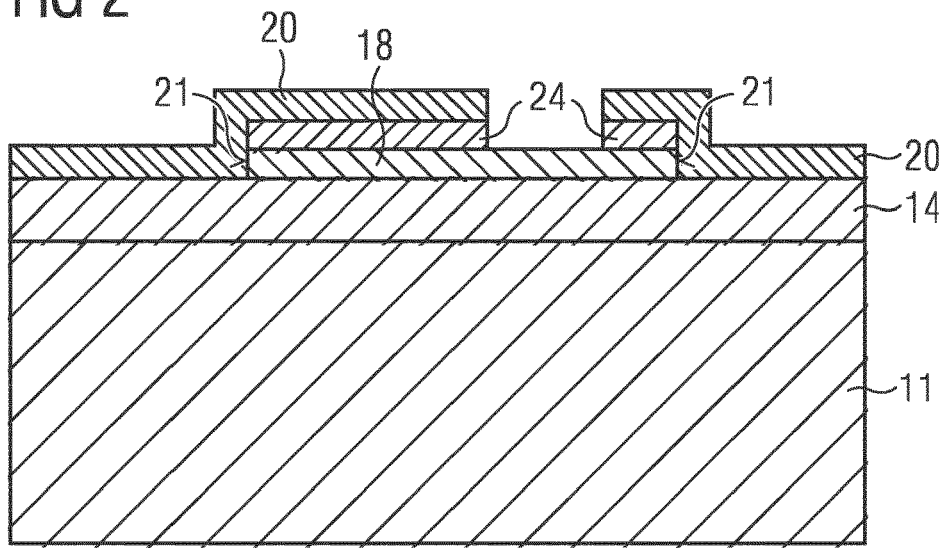
In FIG. 2 a cutaway view of the top side of an embodiment of the semiconductor device is shown.

In FIG. 2 a cutaway view of the top side 16 of an embodiment of the semiconductor device 10 is shown. Only a section of the top side 16 is shown but not the trench 12. The top side 16 of the semiconductor body 11 is coated with the isolation layer 14. On top of the isolation layer 14 a contact pad 18 is formed which comprises a part of the contact layer 17. Except for a part of the contact pad 18, the contact pad 18 is covered with the capping layer 24. The passivation layer 20 covers the top side 16 except for a part of the contact pad 18. At the place of the contact pad 18 that is not covered with the capping layer 24 and the passivation layer 20, the contact pad 18 can be electrically contacted. The side surfaces 21 of the contact pad 18 are in direct contact with the passivation layer 20.

Figure 3:
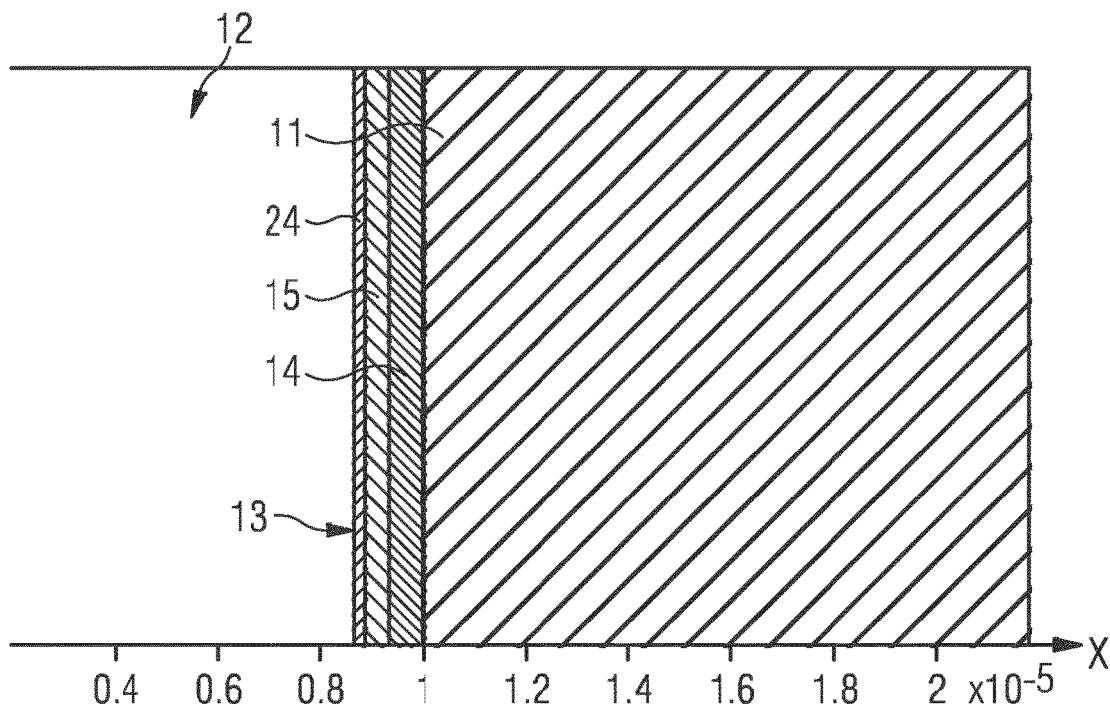
In FIG. 3 the setup for a simulation of the stress within the metallization layer of embodiments of the semiconductor device is shown.

In FIG. 3 the setup for a simulation of the stress within the metallization layer 15 at the inner walls 13 of the trench 12 is shown. A section of the inner wall 13 and the semiconductor body 11 is shown in the cross section in FIG. 3. The stress in the metallization layer 15 is greater than the stress in the other layers. The isolation layer 14 is deposited at the wall 13 and the metallization layer 15 covers the isolation layer 14. On top of the metallization layer 15 the capping layer 24 is arranged. On the x-axis the distance is given in $10^{-5}$ m. This setup shown in FIG. 3 is employed for simulations of stress within the metallization layer 15 of the through-silicon-via 22. In order to determine the stress within the metallization layer 15 a possible defect is located in the metallization layer 15 at the center between the top side 16 and the bottom surface 19. The energy release rate of the possible defect relates to the probability for the propagation of a defect.

Figure 4:
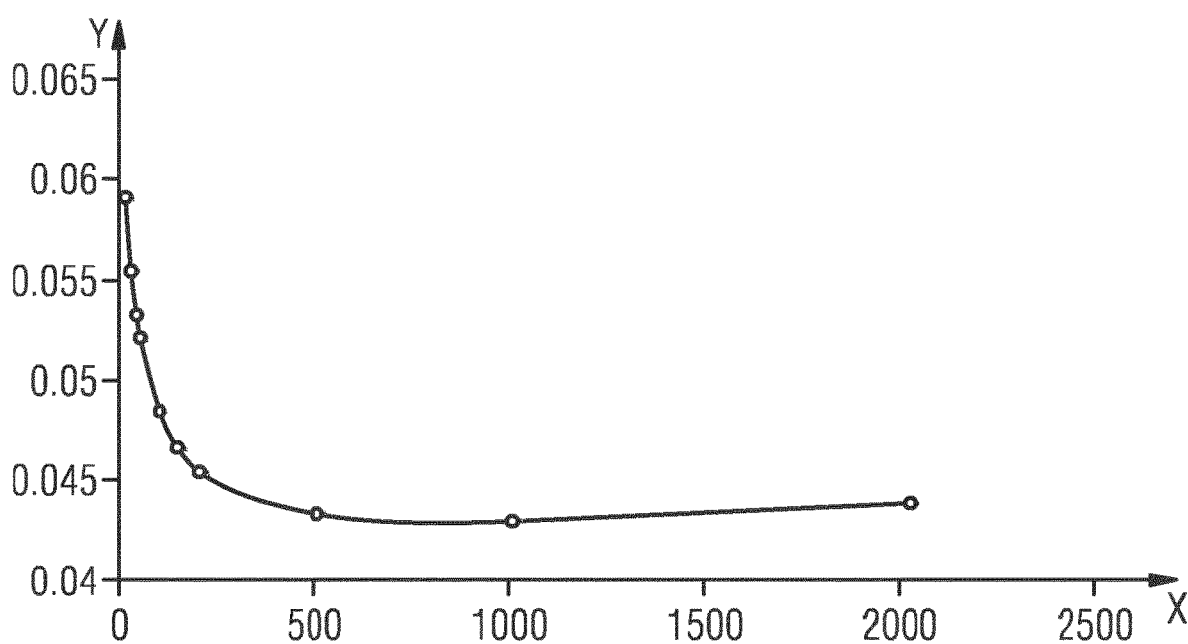

In FIG. 4 the energy release rate of a possible defect in the metallization layer 15 as shown with FIG. 3 is plotted for different thicknesses of the capping layer 24. On the x-axis the thickness of the capping layer 24 is plotted in nanometers. On the y-axis the energy release rate is given in arbitrary units. The higher the energy release rate of a possible defect is, the higher is the possibility for the propagation of the defect or the occurrence of a crack in the metallization layer 15. For the simulation shown in FIG. 4 the thickness of the isolation layer 14 amounts to 600 nm. The radius of the trench 12 amounts to 10 μm and the energy release rate is determined for a change of the temperature from 250° C. to room temperature. The probability for the propagation of a defect is minimal if the thickness of the capping layer 24 is approximately equal to the thickness of the isolation layer 14 or if the thickness of the capping layer 24 amounts to at least 200 nm.

Figure 5:
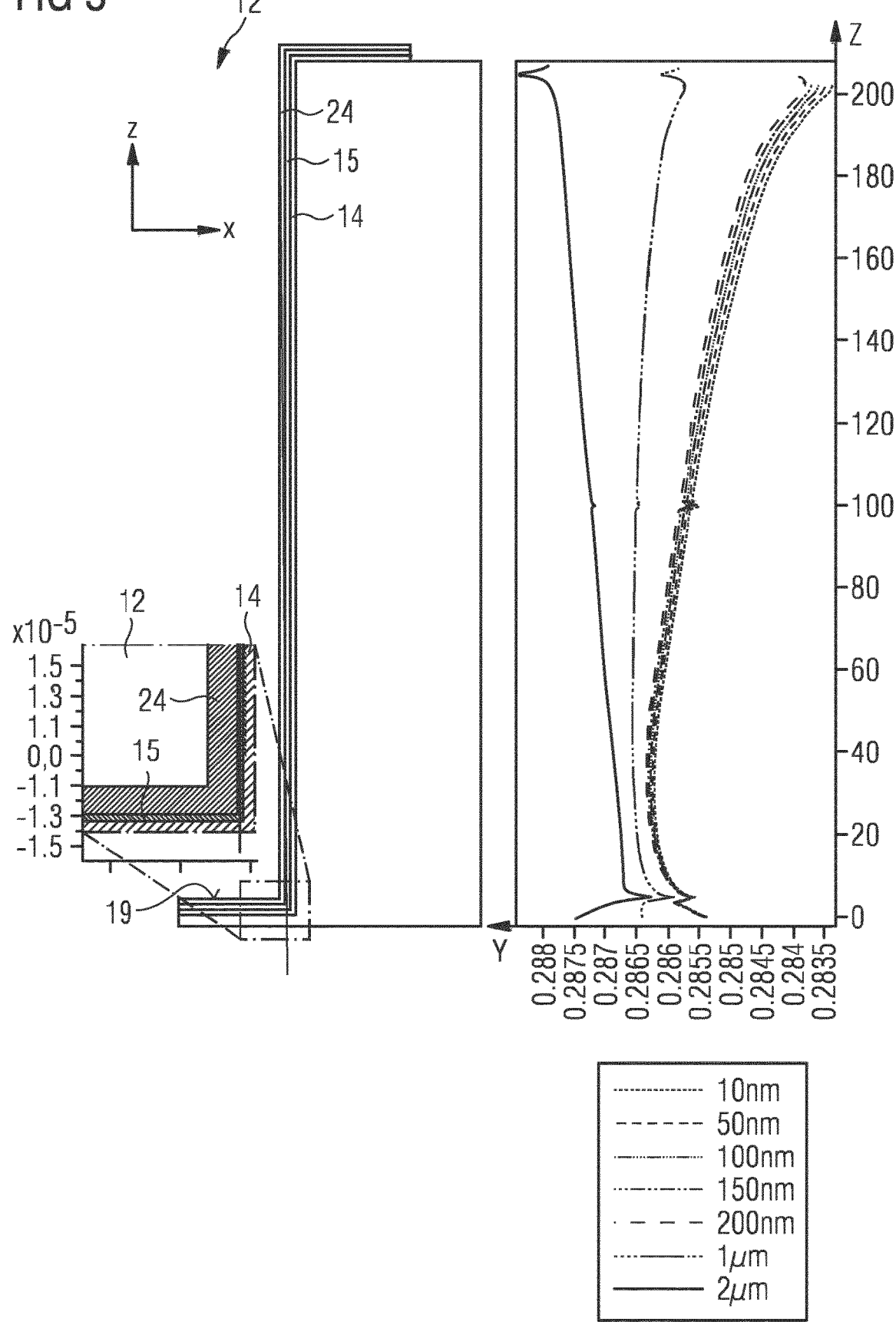

In the left part of FIG. 5 a cross section through a part of the semiconductor device 10 is shown. The cross section shows a part of the trench 12 with the isolation layer 14, the metallization layer 15 and the capping layer 24. The corner of the trench 12 at the bottom surface 19 is shown in an enlarged view. In the right part of FIG. 5 the bending of the layers of the through-silicon-via 22 in dependence of the vertical position within the trench 12 is plotted. On the y-axis the bending is plotted in arbitrary units and on the z-axis the vertical position within the trench 12 is plotted. The bending refers to a bending in lateral direction x which means that the layers of the through-silicon-via 22 either bend towards the inner volume of the trench 12 or towards the semiconductor body 11. The bending is plotted for different thicknesses of the capping layer 24 between 10 nm and 2 μm. This means, for a thickness of 2 μm of the capping layer 24 the three layers of the through-silicon-via 22 bend towards the inner volume of the trench 12. For a thickness of 1 μm the three layers show nearly no bending. For smaller thicknesses the three layers bend towards the semiconductor body 11. As shown in FIG. 4, the bending and thus the probability for the propagation of a defect is minimized if the thickness of the capping layer 24 approximately equals the thickness of the isolation layer 14.

Figure 6:
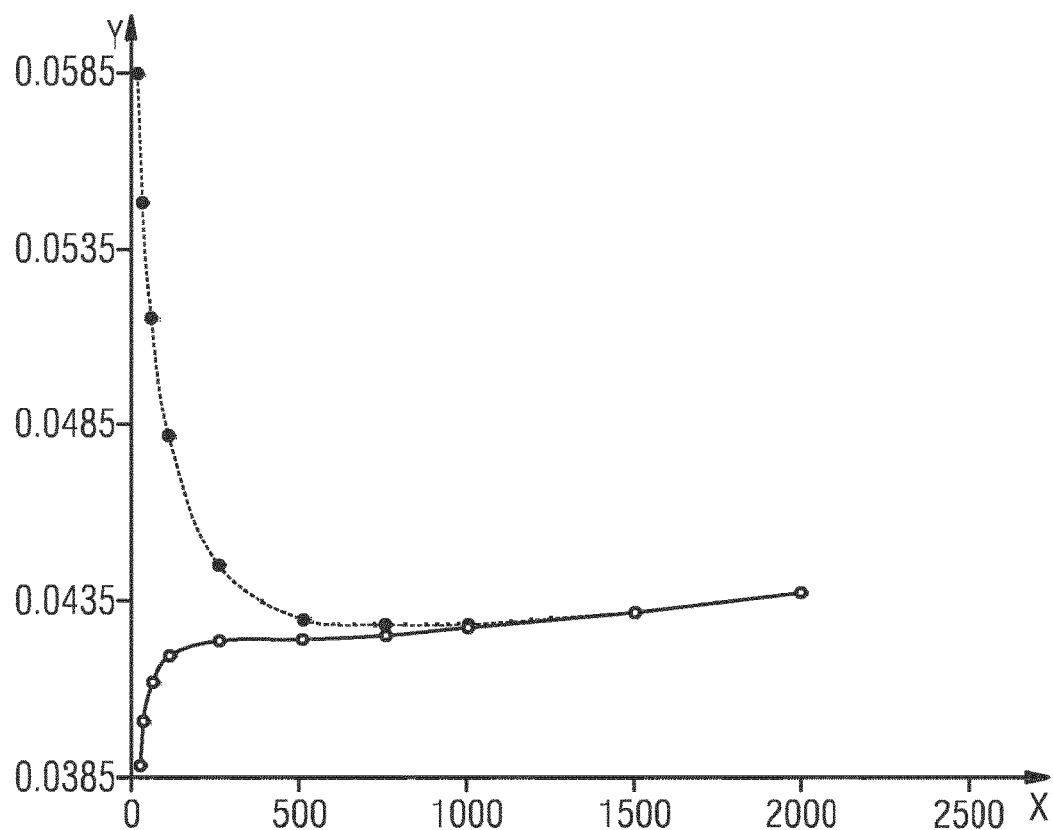

In FIG. 6 the energy release rate of a possible defect in the metallization layer 15 is shown for the setup shown in FIG. 3 and for a further setup where additionally a passivation layer 20 is deposited on the capping layer 24. As in FIG. 4 on the x-axis the thickness of the capping layer 24 is plotted in nanometers. On the y-axis the energy release rate is given in arbitrary units. The dashed line is the same as shown in FIG. 4. The solid line refers to the further setup with a passivation layer 20 comprising $Si_3N_4$. For the case with the passivation layer 20 the probability for the propagation of a defect is minimized for a thickness of zero or close to zero of the capping layer 24.

Nevertheless, the capping layer 24 is required as a protection for the contact layer 17 during processing. Furthermore, the capping layer 24 mechanically stabilizes the layers within the trench 12. Thus, in an embodiment of the semiconductor device 10 the thickness in lateral direction x of the capping layer 24 amounts to at least 200 nm at the side of the trench 12 that faces away from the top side 16.

Figure 7:
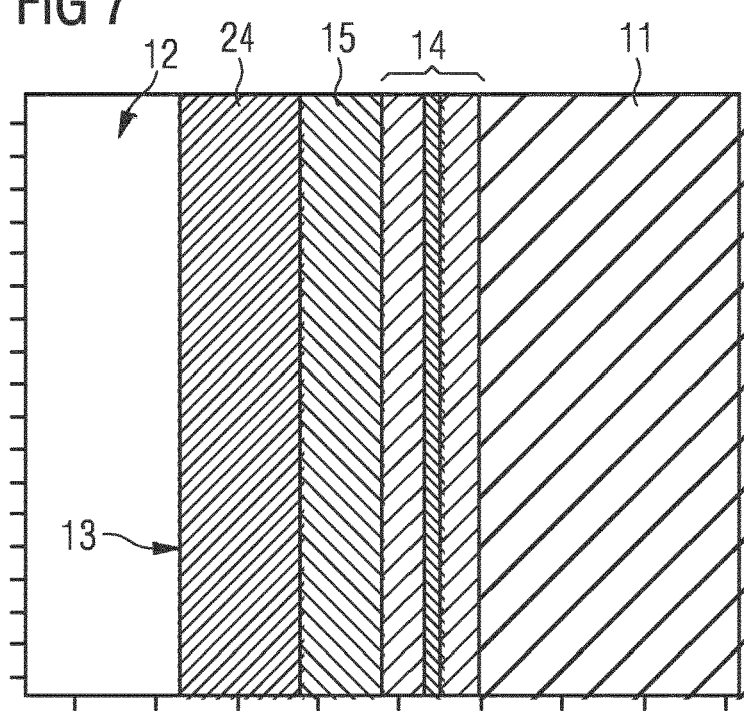

In FIG. 7 a further setup for a simulation of the stress within the different layers at the inner walls 13 of the trench 12 is shown. Similar to FIG. 3 a section of the semiconductor body 11 and the trench 12 are shown. In this embodiment of the semiconductor device 10 the isolation layer 14 comprises three layers. A first layer of the isolation layer 14 comprises $SiO_2$, a second layer of the isolation layer 14 comprises $Si_3N_4$ and a third layer of the isolation layer 14 comprises $SiO_2$. The metallization layer 15 is deposited on the third layer of the isolation layer 14. On top of the metallization layer 15 the capping layer 24 is arranged.

Figure 8:
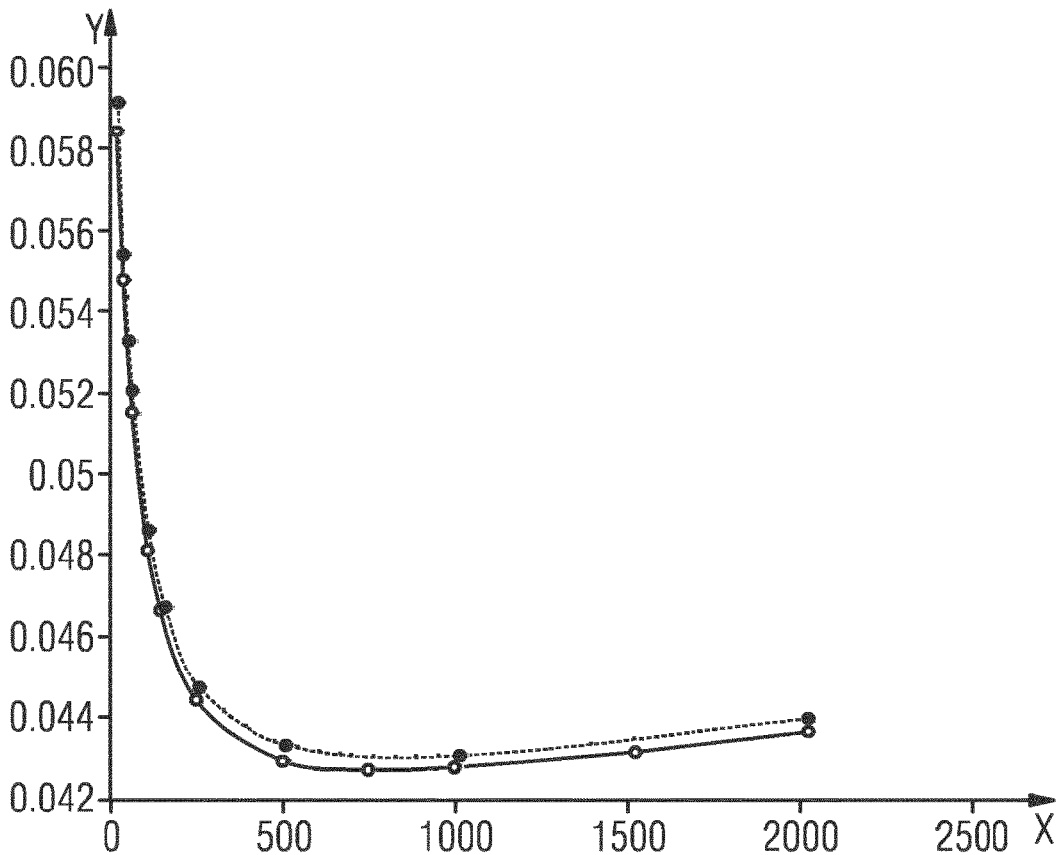

In FIG. 8 the energy release rate of a possible defect in the metallization layer 15 is shown for the setup shown FIG. 7 and in comparison for the setup shown in FIG. 3. The solid line shows the energy release rate for the setup shown in FIG. 7 where the passivation layer 20 comprises three layers and the dashed line shows the energy release rate for the setup shown in FIG. 3 where the passivation layer 20 comprises only one layer. The difference of the energy release rate is only marginal, however the mechanical stability of the layers of the through-silicon-via 22 is improved if the isolation layer 14 comprises at least two layers as each interface acts as a resistance for the growth of a crack.

In FIG. 9 the failure rates of eight different semiconductor devices are compared. On the x-axis different semiconductor devices are plotted. On the y-axis the failure rate is given in arbitrary units. The semiconductor devices are separated into two different groups. The devices D1, D2, D5 and D7 comprise a capping layer 24 which is thinner than for the semiconductor device 10 described here and they comprise a passivation layer which comprises an oxide. The devices D3, D4, D6 and D8 comprise a capping layer 24 as described here and a passivation layer 20 which does not comprise an oxide. The comparison of the failure rates of the two different groups shows, that the failure rates for the semiconductor devices 10 that are implemented as described herein are significantly reduced in comparison to semiconductor devices with a thinner capping layer and a passivation layer that comprises an oxide.

The invention claimed is:

1. A method for manufacturing a semiconductor device, the method comprising:
   providing a semiconductor body,
   forming a trench in the semiconductor body in a vertical direction which is perpendicular to the main plane of extension of the semiconductor body,
   coating inner walls of the trench with an isolation layer,
   coating the isolation layer at the inner walls with a metallization layer,
   coating a top side of the semiconductor body, at which the trench is formed, at least partially with an electrically conductive contact layer, where the contact layer is electrically connected with the metallization layer,
   coating the top side of the semiconductor body at least partially and the metallization layer in the trench with a capping layer, and
   forming a contact pad at the top side of the semiconductor body by removing the contact layer and the capping layer at least partially;
   wherein at the side of the trench that faces away from the top side of the semiconductor body, the thickness in lateral direction of the capping layer amounts to at least 200 nm and differs by less than 20% from the thickness of the isolation layer, where the lateral direction is perpendicular to the vertical direction.

2. The method according to claim 1, wherein the contact layer and the capping layer are in direct contact with each other at the top side of the semiconductor body.

3. The method according to claim 1, wherein the capping layer is formed after the deposition of the contact layer.

4. The method according to claim 1, wherein the capping layer comprises a dielectric material.

5. The method according to claim 1, wherein for forming the contact pad the capping layer is removed from the contact layer at least partially.

6. The method according to claim 1, wherein the trench comprises an inner volume which is not filled with any material.

7. The method according to claim 1, comprising coating the top side of the semiconductor body and the trench with a passivation layer.

8. The method according to claim 7, wherein the passivation layer is in direct contact with the capping layer and with an inner volume of the trench.

9. The method according to claim 1, wherein the metallization layer is electrically connected with an integrated circuit of the semiconductor device.

10. The method according to claim 1, wherein the isolation layer comprises at least two layers.

11. A semiconductor device comprising:
    a semiconductor body,
    a trench that extends through at least a part of the semiconductor body in a vertical direction from a top side of the semiconductor body, where the vertical direction is perpendicular to the main plane of extension of the semiconductor body,
    an isolation layer covering at least partially inner walls of the trench and the top side of the semiconductor body,
    a metallization layer covering the isolation layer,
    an electrically conductive contact pad at the top side of the semiconductor body, where the contact pad is electrically connected with the metallization layer, and
    a capping layer covering the top side of the semiconductor body at least partially and the metallization layer;
    wherein at the side of the trench that faces away from the top side of the semiconductor body, the thickness in lateral direction of the capping layer amounts to at least 200 nm and differs by less than 20% from the thickness of the isolation layer, where the lateral direction is perpendicular to the vertical direction.

12. The semiconductor device according to claim 11, wherein a passivation layer covers the capping layer and the top side of the semiconductor body at least partially and at least one side surface of the contact pad is in direct contact with the passivation layer.

* * * * *